United States Patent
Lee et al.

(10) Patent No.: US 7,116,255 B2
(45) Date of Patent: Oct. 3, 2006

(54) MULTIPLYING DIGITAL TO ANALOG CONVERTER AND MULTIPATH PIPE LINE ANALOG TO DIGITAL CONVERTER USING THE SAME

(75) Inventors: Seung-Chul Lee, Daejeon (KR); Kwi-Dong Kim, Daejeon (KR); Gyu-Hyun Kim, Daejeon (KR); Jong-Ki Kwon, Daejeon (KR); Jong-Dae Kim, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 0 days.

(21) Appl. No.: 11/153,045

(22) Filed: Jun. 14, 2005

(65) Prior Publication Data

US 2006/0109154 A1    May 25, 2006

(30) Foreign Application Priority Data

Nov. 25, 2004    (KR) ...................... 10-2004-0097479

(51) Int. Cl.
H03M 1/66   (2006.01)

(52) U.S. Cl. ...................................... 341/144; 333/133

(58) Field of Classification Search ................ 341/155, 341/172, 161, 144; 330/133, 310
See application file for complete search history.

(56) References Cited

U.S. PATENT DOCUMENTS

| | | | | |
|---|---|---|---|---|
| 4,229,697 | A | * | 10/1980 | Petrosky et al. ............. 324/244 |
| 4,363,025 | A | * | 12/1982 | Jackson ....................... 341/121 |
| 4,661,802 | A | * | 4/1987 | Yukawa ........................ 341/150 |
| 5,136,257 | A | * | 8/1992 | Reading ....................... 330/129 |
| 5,231,360 | A | * | 7/1993 | Storey .......................... 330/86 |
| 5,281,810 | A | * | 1/1994 | Fooks et al. ............. 250/222.1 |
| 5,294,926 | A | | 3/1994 | Corcoran |
| 5,708,376 | A | * | 1/1998 | Ikeda .......................... 327/50 |
| 6,133,864 | A | | 10/2000 | Sabatini |
| 6,160,448 | A | * | 12/2000 | Werrbach ............... 330/124 R |
| 6,271,784 | B1 | * | 8/2001 | Lynn et al. ................. 341/150 |
| 6,608,516 | B1 | * | 8/2003 | Lennous ..................... 327/344 |
| 6,867,723 | B1 | * | 3/2005 | Tachibana et al. .......... 341/155 |
| 6,956,515 | B1 | * | 10/2005 | Keehr et al. ................ 341/150 |
| 2002/0167433 | A1 | * | 11/2002 | Soundarapandian et al. ..... 341/155 |

OTHER PUBLICATIONS

"A 10-Bit 150-MS/s, Parallel Pipeline A/D Converter In 0.6 um CMOS", J. Talebzadeh, et al., 2002 IEEE, pp. 133-136, no month.
"A 10-ABit 200-MS/s CMOS Parallel Pipeline A/D Converter", L. Sumanen, et al., 2001 IEEE, pp. 1048-1055, no month.

* cited by examiner

Primary Examiner—Peguy JeanPierre
(74) Attorney, Agent, or Firm—Blakely Sokoloff Taylor & Zafman (57) ABSTRACT

A multiplying digital to analog converter comprising a digital to analog converter having a plurality of capacitors coupled in parallel, applying first signals to the capacitors during a sampling period, and applying second signals to the capacitors during an amplifying period, and an amplifier including a first amplifier electrically coupled to the digital to analog converter; a second amplifier electrically coupled to the first amplifier; and a first switch electrically coupled between an input end and an output end of the second amplifier, being turned off during a sampling period, and being turned off during an amplifying period.

16 Claims, 5 Drawing Sheets

MULTIPLYING DIGITAL TO ANALOG CONVERTER AND MULTIPATH PIPE LINE ANALOG TO DIGITAL CONVERTER USING THE SAME

CROSS REFERENCE TO RELATED APPLICATION

This application claims priority to and the benefit of Korean Patent Application No. 10-2004-0097479 filed in the Korean Intellectual Property Office on Nov. 25, 2004, the entire content of which is incorporated herein by reference.

BACKGROUND OF THE INVENTION (a) Field of the Invention

The present invention relates to a multiplying digital to analog converter, and more particularly, relates to a multipath pipelined analog to digital converter using the same.

(b) Description of the Related Art

A multipath pipelined analog to digital converter realizes high-speed performance by sequentially processing one sample and hold output through each path and sequentially outputting the processed output through a multiplexer (MUX).

Hereinafter, a multiplying digital to analog converter is referred to as a MDAC, and an analog to digital converter is referred to as an ADC throughout the specification.

Figure 1:
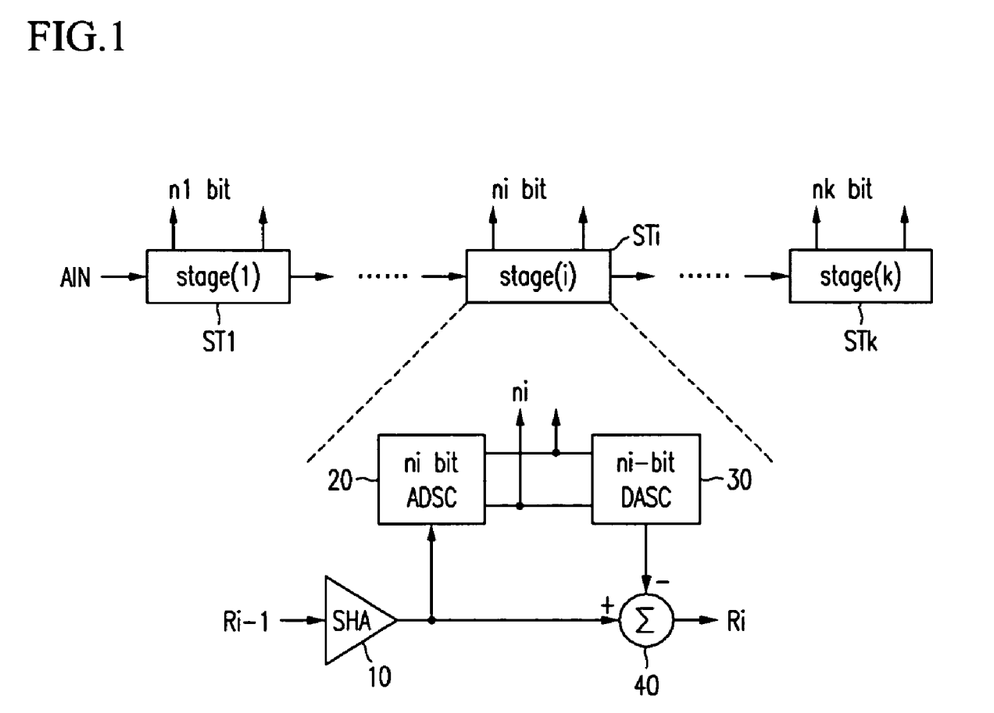
FIG. 1 is a conceptual scheme of a pipelined analog to digital converter.

FIG. 1 is a conceptual scheme of a general pipelined ADC.

Referring to FIG. 1, a function of the MDAC, which is a pipelined ADC, will be described in detail.

The pipelined ADC digitalizes an analog input signal (AIN) in increments over multiple stages ST1 to STk. Within each stage, a sample and hold amplifier (SHA) 10, an n-bit ADSC (sub-ADC) 20, an n-bit DASC (sub-DAC) 30, and an adder 40 are included. The SHA 10 receives an analog signal Ri-1 of a previous stage, and holds the analog signal Ri-1 for a defined period of time after sampling it. The n-bit ADSC 20 converts the sampled analog signal Ri-1 into a digital signal and outputs the digital signal. The n-bit DASC 30 converts the digital signal output from the n-bit ADSC 20 into an analog signal. The adder 40 adds the analog signal output from the n-bit DASC 30 and the previous stage analog signal passed through the sample and hold amplifier 10, and generates an analog signal Ri to be input to a SHA 10 of a next successive stage.

For example, each stage processes 4-bit analog to digital convergence as follows. A 4-bit ADSC 20 receives an input analog signal and outputs a 4-bit digital signal. A 4-bit DASC 30 receives the 4-bit digital signal and converts it into an analog signal. The adder 40 substrates the analog signal outputted from the 4-bit DASC 30 from the analog signal outputted from the SHA 10, which corresponds to the analog signal outputted from the previous stage. Then, the adder 40 outputs the result analog signal as an analog signal for the next successive stage In each stage, the n-bit DASC 30, the adder 40, and the SHA 10 are provided in a format of the MDAC, except for the n-bit ADSC 20. In this case, each stage is configured with the sub-ADC and MDAC.

Stage redundancy in the multipath pipelined analog to digital converter is exploited to convert a portion of an analog signal into a digital signal for desired signal conversion.

Figure 2:
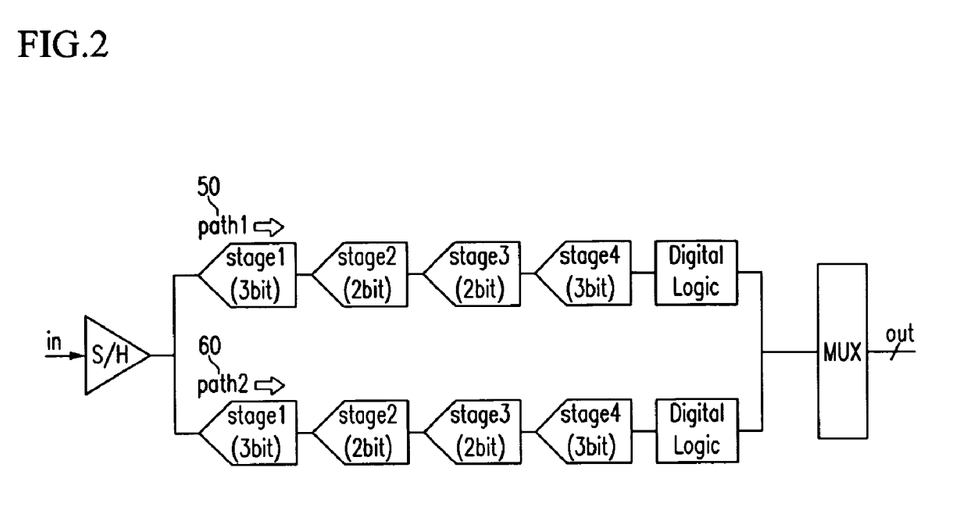
FIG. 2 is a conceptual scheme of a multipath pipelined analog to digital converter.

FIG. 2 shows a general multipath pipelined ADC.

FIG. 2 conceptually illustrates a 10-bit multipath pipelined ADC having a first path 50 path1 and a second path 60 path2, different from the pipelined ADC of FIG. 1.

Considering that the operation speed of a MDAC block in each stage affects the speed of all the ADCs, the multipath pipelined ADC processes the same amount of data even though the operation speed is set to be half as much as that of a single path ADC because a signal sampled through a sample and holding circuit is alternately transmitted to the first path path1 and the second path path2 to be processed.

However, when using multiple paths, an offset between the paths may be differentiated and thus each path may output different digital signals in response to the same analog signal input, thereby causing degradation of resolution. Therefore, most of the multipath pipelined ADCs employ a calibration circuit for calibrating differential offsets between the multiple paths.

The calibration circuit stores an offset difference between the paths when no signal is input, and subtracts/adds a digital value from/to an output of each path corresponding to the offset difference when a signal is input to calibrate the differential offsets between the paths. In other words, the conventional multipath pipelined ADC estimates a DC offset between the paths to calibrate an estimated amount of offsets in one of the paths, or stores a code difference between the paths in a memory to calibrate the code difference while operating the calibration circuit. Such a calibrating method requires additional operations to estimate offsets between the paths and adds circuit complexity to calibrate the offsets, thereby increasing cost.

The U.S. Pat. No. 5,294,926 discloses a method for removing error factors in multiple paths by using a calibration algorithm. However, the method has a problem of requiring a plurality of circuits for realizing the calibration algorithm thereby increasing cost.

Another type of calibration circuit is disclosed by L. Sumane (entitled "A 10 bit 200 MS/s CMOS Parallel A/D converter", IEEE JSSC, Vol. 36, No. 7, pp 1048~1053, July, 2001). The circuit, including a register in an ADC output to remove an offset in a multipath ADC, stores on offset in each path, and calibrates a digital value corresponding to the offset in each path in the ADC output. However, the circuit requires an additional circuit for removing the offset and additional operations for estimating and removing the offset.

The information disclosed in this Background of the Invention section is only for enhancement of understanding of the background of the invention, and therefore, unless explicitly described to the contrary, it should not be taken as an acknowledgement or any form of suggestion that this information forms the prior art that is already known in this country to a person of ordinary skill in the art.

SUMMARY OF THE INVENTION

It is an advantage of the present invention to provide an analog to digital converter capable of efficiently removing an offset generated in each path with high speed and high resolution.

In particular, a purpose of the present invention is to provide a multipath pipelined analog to digital converter that is equipped with an improved multiplying digital to analog converter (MDAC).

In addition, another purpose of the present invention is to provide a MDAC that effectively removes offsets generated on multiple paths by diversifying an operating point of an amplifier in a MDAC circuit.

The multipath pipelined analog to digital converter includes a plurality of stages, and each stage includes a MDAC and an analog to digital converter. The number of bits in each stage of the analog to digital converter may be determined in consideration of a total number of bits, power consumption, and linearity.

In one aspect of the present invention, there is provided a multiplying digital to analog converter including a digital to analog converter and an amplifier. The digital to analog converter includes a plurality of capacitors coupled in parallel, applies first signals to the capacitors during a sampling period, and applies second signals to the capacitors during an amplifying period. The amplifier includes a first amplifier, a second amplifier, and a first switch. The first switch is turned off during the sampling period and turned on during the amplifying period. The first amplifier is coupled to the digital to analog converter, the second amplifier is coupled to the first amplifier, and the first switch is coupled between an input end and an output end of the second amplifier.

In another aspect of the present invention, there is provided a multiplying digital to analog converter including a digital to analog converter and an amplifier. The digital to analog converter includes a plurality of capacitors coupled in parallel, applies first signals to the capacitors during a sampling period, and applies second signals to the capacitors during an amplifying period. The amplifier includes a first amplifier, a second amplifier, a first capacitor, a second capacitor, and a first switch. The first switch is turned on during the sampling period, and turned off during the amplifying period. The first amplifier is coupled to the digital to analog converter, the second amplifier is coupled to the first amplifier, the first capacitor is coupled between an input end and an output end of the second amplifier, the second capacitor is coupled to both ends of the first capacitor, and the first switch is coupled between the first and second capacitors.

In further another aspect of the present invention, there is provided a multiplying digital to analog converter including a digital to analog converter and an amplifier having a first amplifier and a bias input end. The digital to analog converter includes a plurality of capacitors coupled in parallel, applies first signals to the capacitors during a sampling period, and applies second signals to the capacitors during an amplifying period. The amplifier includes a first amplifier, a second amplifier, a bias input end, and controls currents of the first and second amplifiers. The first amplifier is coupled to the digital to an analog converter, the second amplifier is coupled to the first amplifier, and the bias input end is coupled to an end of the first amplifier and an end of the second amplifier.

In further another aspect of the present invention, there is provided a multipath pipelined analog to digital converter that includes a plurality of stages. Each stage includes an analog to digital converter and a multiplying digital to analog converter.

DETAILED DESCRIPTION OF THE PREFERRED EMBODIMENTS

In the following detailed description, only certain exemplary embodiment of the present invention has been shown and described, simply by way of illustration. As those skilled in the art would realize, the described embodiments may be modified in various different ways, all without departing from the spirit or scope of the present invention. Accordingly, the drawings and description are to be regarded as illustrative in nature, and not restrictive.

Figure 3:
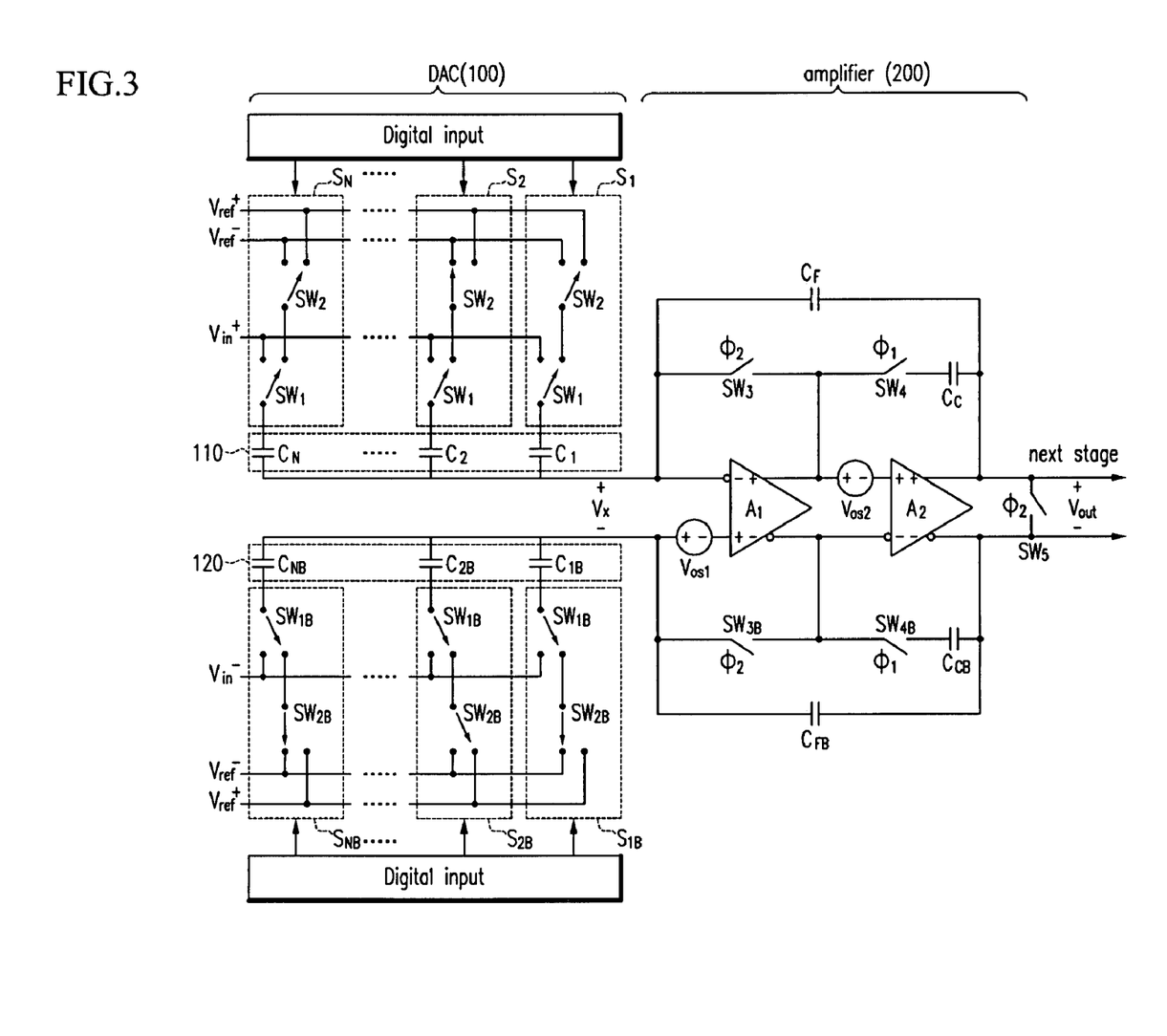
FIG. 3 is a circuit diagram of a multiplying analog to digital converter according to a first embodiment of the present invention.

FIG. 3 is a circuit diagram of a multiplying analog to digital converter (MDAC) according to a first embodiment of the present invention.

The MDAC is provided in a like manner to a MDAC in each stage of a multipath pipelined analog to digital converter (ADC) according to an embodiment of the present invention, and thus a detailed description of the MDAC in each stage will be omitted.

Hereinafter, the MDAC according to a first embodiment of the present invention will be described.

Referring to FIG. 3, the MDAC includes a digital to analog converter (DAC) 100 and an amplifier 200. The DAC 100 includes a first capacitor array ($C_1$ to $C_N$) 110, a second capacitor array ($C_{1B}$ to $C_{NB}$) 120, first selection circuits $S_1$ to $S_N$, and second selection circuits $S_{1B}$ to $S_{NB}$. The amplifier 200 includes a first amplifier A1, a second amplifier A2, compensation capacitors $C_C$ and $C_{CB}$, feedback capacitors $C_F$ and $C_{FB}$, and switches $SW_3$, $SW_{3B}$, $SW_4$, $SW_{4B}$, and $SW_5$.

Typically, an n-bit MDAC requires $2^n$ capacitors. 'N' in the capacitor arrays represents $2^n$, and 'n' represents a number of bits of a digital signal to be converted in each stage according to the first embodiment of the present invention.

In the DAC 100, first ends of capacitors C1 to $C_N$ in the first capacitor array 110 are respectively coupled to the first selection circuits S1 to $S_N$. Meanwhile, first ends of capacitors $C_{1B}$ to $C_{BN}$ in the second capacity array 120 are respectively coupled to the second selection circuits $S_{1B}$ to $S_{NB}$. Second ends of the first and second capacitor arrays 110 and 120 are coupled to an input end of the first amplifier A1, and an output end of the first amplifier A1 is directly coupled to an input end of the second amplifier.

The respective first selection circuits $S_1$ to $S_N$ include the switches $SW_1$ and $SW_2$, receive a clock signal during a sampling period, and apply an analog input voltage $V_{IN}$+ to the first capacitor array 110 through the switch $SW_1$. In addition, the respective first selection circuits $S_1$ to $S_N$ receive an n-bit digital signal from a sub-analog to digital converter (sub-ADC) during a holding period and apply a positive reference voltage $V_{REF}$+ or a negative reference voltage $V_{REF}$− to the first capacitor array 110 through the switch $SW_2$. Herein, the positive reference voltage $V_{REF}$+ is applied to the first capacitor array 110 when the digital signal is set to be '1', and the negative reference voltage $V_{REF}$+ is applied thereto when the digital signal is set to be '0'.

All elements in the second selection circuit are connected between those, and are operated, as those in the first selection circuit which are arranged with the second selection circuit in a like manner. However, the negative reference voltage $V_{REF}-$ is applied to the first capacitor array 110 when the digital signal is set to be '1', and the positive reference voltage $V_{REF}+$ is applied to the first capacitor array when the digital signal is set to be '0' in the second selection circuits.

In the amplifier 200 of the MDAC, a first end of the switch $SW_3$ is coupled to the second end of the first capacitor array 110 and the input end of the first amplifier A1, and a second end of the switch $SW_3$ is coupled to a first end of the switch $SW_4$ and the output end of the first amplifier A1. A second end of the switch $SW_4$ is coupled to a first end of the compensation capacitor $C_C$, and a second end of the $C_C$ is coupled to an output end of the second amplifier A2. The feedback capacitor $C_F$ is coupled to the first end of the switch $SW_3$ and the second end of the compensation capacitor $C_C$.

Operations of the switches $SW_{3B}$, the switch $SW_{4B}$, the compensation capacitor $C_{CB}$, and the feedback capacitor $C_{FB}$ correspond to operations of the corresponding switch $SW_3$, the switch $SW_3$, the capacitor Cc, and the feedback capacitor $C_{FB}$.

An operation of the MDAC will be described with respect to a clock holding period $\phi_1$ and a clock sampling period $\phi_2$ according to the first embodiment of the present invention.

During the clock sampling period $\phi_2$, the first capacitor array 110 is coupled to an output voltage $V_{IN}^+$ of a previous stage through the switch $SW_1$ of the first selection circuit, and stores the output voltage $V_{IN}^+$. Herein, the switch $SW_2$ is turned off and thus the positive reference voltage $V_{REF}^+$ or the negative reference voltage $V_{REF}^-$ is no longer applied to the first capacitor array 110, a first offset voltage $V_{OS1}$ is applied to another end of the first capacitor array 110, and the switches $SW_3$ and $SW_5$ are turned on, and the switch $SW_4$ is turned off.

During the clock holding period $\phi_1$, in the first capacity array 110, the switch SW1 of the first selection circuit is switched to the switch $SW_2$ by the output voltage $V_{IN}^+$, and the positive reference voltage $V_{REF}^+$ or the negative reference voltage $V_{REF}^-$ is applied to the switch $SW_2$. Herein, each capacitor in the first capacitor array 110 is applied with the positive reference voltage $V_{REF}^+$ or the negative reference voltage $V_{REF}^-$ depending on a digital output value of the sub-ADC. The switch $SW_3$ is turned off and the switch $SW_4$ is turned on.

An output from the output end of the amplifier is obtained by charge redistribution between the first capacitor array 110 and the feedback capacitor $C_F$. The compensation capacitor $C_C$ maintains stability in a loop by obtaining a phase margin in a multistage amplifier.

The operation of the MDAC will be described with reference to the following equations that are related to the charge redistribution according to the first embodiment of the present invention in the assumption that values of the capacitors in the capacitor array are given to be C.

As shown in FIG. 3, the MDAC turns off the switches $SW_4$ and $SW_{4B}$ during the sampling period $\phi_2$, and thus an offset voltage in the input end of the first amplifier 110 is fed back and stored in the capacitor array to remove the offset voltage. Therefore, charges $Q_2$ sampled in the capacitor array during the sampling period $\phi_2$ are given as Equation 1:

$$Q_2 = (V_{OS1} - V_{IN})NC + V_{OS1}C_F \qquad \text{[Equation 1]}$$

where $V_{IN}$ is an input voltage, N is a number of the capacitors in the capacitor array, $V_{OS1}$ is a first offset voltage, and $C_F$ is the feedback capacitor.

Charges Q1 stored in the capacitor array and the feedback capacitor $C_F$ during the holding period $\phi_1$ is given as Equation 2:

$$\begin{aligned} Q1 &= (V_X - V_{OUT})C_F + \\ &\quad (V_X - V_{REF})MC(V_X + V_{REF})(N - M)C \\ &= (V_X - V_{OUT})C_F + V_X NC + V_{REF}(N - 2M)C \\ &= V_X(NC + C_F) + V_{REF}(N - 2M)C - V_{OUT}C_F \end{aligned} \qquad \text{[Equation 2]}$$

where $V_X$ is a voltage at the output end of the capacitor array, $V_{OUT}$ is a voltage at the output end of the MDAC, $V_{REF}$ is the reference voltage, and M is a number of the capacitors in the capacitor array coupled to the negative reference voltage $V_{REF}^-$ ($0 \leq M \leq N$).

The charges in each phase are identical, and therefore Q1 is equal to Q2. Accordingly, Equation 3 is derived from Equation 1 and Equation 2:

$$V_{IN}NC = V_{OS1}(NC+C_F) - V_X(NC+C_F) - V_{REF}(N-2M)C + V_{OUT}C_F. \qquad \text{[Equation 3]}$$

The output voltage $V_{OUT}$ is given as Equation 4:

$$V_{OUT} = -[(V_X - V_{OS1})A_1 - V_{OS2}]A_2 = -(V_X - V_{OS})A \qquad \text{[Equation 4]}$$

where $$A = A_1 \times A_2$$

and, $$V_{OS} = (V_{OS1} + V_{OS2}/A_1).$$

Accordingly, the voltage $V_X$ is given as Equation 5, which is derived from Equation 4:

$$V_X = -V_{OUT}/A + V_{OS}. \qquad \text{[Equation 5]}$$

When a gain A of the multistage amplifier having the first and second amplifiers is set to be great enough, $V_X = V_{OS}$ is satisfied. Thus, the output voltage $V_{OUT}$ of the MDAC is given as Equation 6. Herein, $V_X = V_{OS}$ is substituted to Equation 3:

$$\begin{aligned} V_{OUT} &= [V_{IN}NC - V_{OS1}(NC+C_F) + \\ &\quad V_{OS}(NC+C_F) + \\ &\quad V_{REF}(N-2M)C]/ \\ C_F &= [V_{IN}NC + (V_{OS} - V_{OS1})(NC+C_F) + \\ &\quad V_{REF}(N-2M)C]/ \\ C_F &= [V_{IN} - V_{REF}(2M/N - 1)] \times \\ &\quad NC/C_F + (V_{OS} - V_{OS1})(NC+C_F)/C_F. \end{aligned} \qquad \text{[Equation 6]}$$

Herein, $V_{OS} = (V_{OS1} + V_{OS2}/A_1)$. Thus, when the gain A1 of the first amplifier is set to be great, $V_{OS2}/A_1$ becomes zero, and $V_{OS} = (V_{OS1} + V_{OS2}/A_1) \approx V_{OS1}$. In this case, $(V_{OS} - V_{OS1})(NC + C_F)/C_F$ is deleted in Equation 6, and thus the effect of the offset voltage is removed.

In other words, the offset voltage is removed by setting the gain A1 of the first amplifier to be high in the multistage amplifier to prevent degradation of resolution.

According to the first embodiment of the present invention, the offset is deleted by using the first amplifier in the two-stage amplifier. Thus, it is possible to design a multistage amplifier that satisfies characteristics of a feedback loop varying in the sampling and holding periods $\phi_2$ and $\phi_1$.

In other words, the feedback loop is configured with the first amplifier during the sampling period $\phi_2$ to store the offset while obtaining a high phase margin because load of the amplifier is low and a feedback gain is high during the sampling period $\phi_2$. However, the feedback loop is configured with the first and second amplifiers during the holding period $\phi_1$ to obtain a high gain because the load of the amplifier is high and the feedback gain is low during the holding period $\phi_1$. During the sampling period $\phi_2$, power consumption is minimized by intercepting a portion or an entire current to the second amplifier.

Thus, the MDAC according to the first exemplary embodiment of the present invention may achieve the feedback loop as a single-stage during the sampling period $\phi_2$ by turning off the switch $SW_4$ to intercept the compensation capacitor $C_C$. Thus, operation of the first amplifier may be maximized. The MDAC uses only the first amplifier of the multistage amplifier during the sampling period to delete the offset to thereby gain a larger phase margin.

Therefore, the MDAC is not affected by the offset voltage of the amplifier, and an output voltage of the MDAC in this case is given as Equation 7:

$$V_{OUT} = [V_{IN} - V_{REF}(2M/N-1)] \times NC/C_F. \qquad \text{[Equation 7]}$$

As shown in Equation 7, the MDAC substrates $V_{REF}(2M/N-1)$ from an input voltage $V_{IN}$ according to values of N and M, and amplifies the subtraction output of the MDAC by $NC/C_F$. The values of N and M are determined by a digital output of the sub-ADC.

The operation of the MDAC has been described with reference to the first capacitor array 110, the first selection circuit, the switch $SW_3$, the switch $SW_4$, and the compensation capacitor $C_C$, but operations of the corresponding second capacitor array 120, the second selection circuit, the switch $SW_{3B}$, the switch $SW_{4B}$, and the compensation capacitor $C_{CB}$ correspond to the operations of the first selection circuit, the switch $SW_3$, the switch $SW_4$, and the compensation capacitor $C_C$, and therefore, no corresponding descriptions will be provided.

Figure 4:
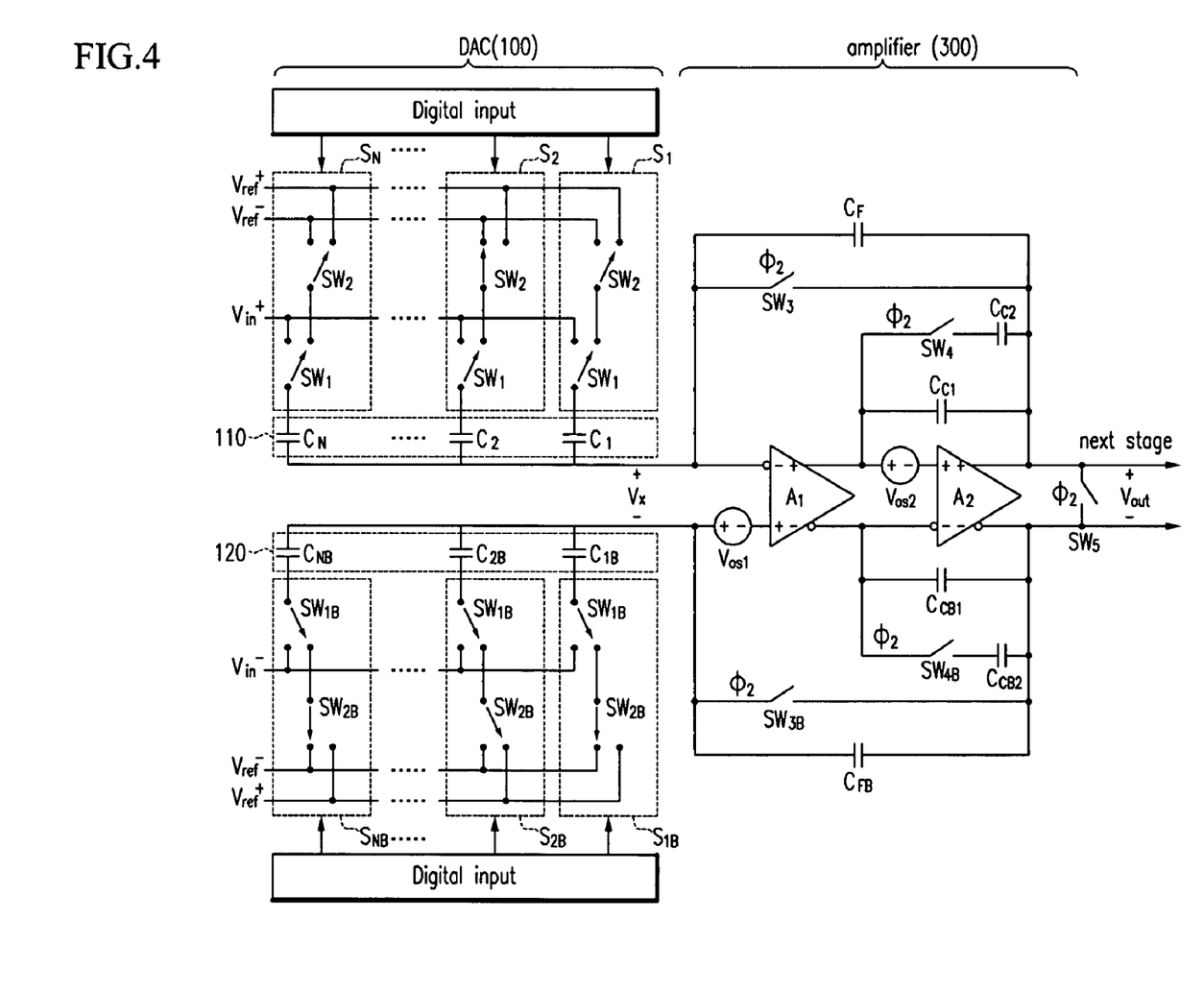
FIG. 4 is a circuit diagram of a multiplying analog to digital converter according to a second embodiment of the present invention.

With reference to FIG. 4, an MDAC according to a second embodiment of the present invention will be described.

FIG. 4 is a circuit diagram of the MDAC according to the second embodiment of the present invention.

As shown therein, the MDAC includes a DAC 100 which corresponds to the DAC in the first embodiment of the present invention, and an amplifier 300.

The amplifier 300 includes a first amplifier A1, a second amplifier A2, first compensation capacitors $C_{C1}$ and $C_{CB1}$, second compensation capacitors $C_{C2}$ and $C_{CB2}$, feedback capacitors $C_F$ and $C_{FB}$, and switches $SW_3$, $SW_{3B}$, $SW_4$, $SW_{4B}$, and $SW_5$.

A first end of the switch $SW_3$ is coupled to input ends of the first capacitor array 110 and the first amplifier A1, and a second end thereof is coupled to an output end of the second amplifier A2. A first end of the switch $SW_4$ is coupled to an output end of the first amplifier A1 and a first end of the first compensation capacitor $C_{C1}$, and a second end thereof is coupled to a first end of the second compensation capacitor $C_{C2}$. A first end of the first compensation capacitor $C_{C1}$ is coupled to an input end of the second amplifier A2, and a second end thereof is coupled to the output end of the second compensation capacitor $C_{C2}$. The first end of the second compensation capacitor $C_{C2}$ is coupled to the second end of the switch $SW_4$, and a second end thereof is coupled to the output end of the second amplifier $A_2$ and the second end of the switch $SW_3$. A first end of the feedback capacitor $C_F$ is coupled to the first end of the switch $SW_3$, and a second end thereof is coupled to the second end of the switch $SW_3$.

Connections between the first compensation capacitor $C_{C1}$, the second compensation capacitor $C_{C2}$, the feedback capacitor $C_F$, and the switches $SW_3$ and $SW_4$ are applied in a like manner to the corresponding first capacitor $C_{CB1}$, the corresponding second compensation capacitor $C_{CB2}$, the corresponding feedback capacitor $C_{FB}$, and the corresponding switches $SW_{3B}$ and $SW_{4B}$.

An operation of the MDAC according to the second embodiment of the present invention will be described in more detail.

An operation of the DAC 100 according to the second embodiment of the present invention is the same as the operation of the DAC 100 according to the first embodiment of the present invention.

The amplifier 300 will now be described in more detail.

During a clock sampling period $\phi_2$, an input voltage $V_{IN}^+$ is stored in the first capacitor array 110 through the first selection circuit. Herein, the switches $SW_3$, $SW_4$, and $SW_5$ are turned on.

The input voltage $V_{IN}^+$ is intercepted, and a positive reference voltage $V_{REF}^+$ or a negative reference voltage $V_{REF}^-$ is applied to the first capacitor array 110 during a clock holding period $\phi_1$. A digital output value determines whether to apply the positive reference voltage $V_{REF}^+$ or the negative reference voltage $V_{REF}^-$ to the first capacitor array 110, and the switches $SW_3$ and $SW_4$ are turned off.

The operation of the MDAC according to the second embodiment of the present invention will be described with reference to the following charge redistribution equations.

In the MDAC, an output end of the amplifier is fed back to an input end thereof through the switches $SW_3$ and $SW_{3B}$ during the sampling period $\phi_2$ to store an offset. In this case, charges $Q_2$ sampled in the capacitor row during the sampling are given in Equation 8:

$$Q2 = [(V_{CM} + V_{OS} - V_{IN}^+) - (V_{CM} - V_{IN}^-)] \times \qquad \text{[Equation 8]}$$
$$NC = (V_{OS} - V_{IN})NC.$$

The operation of the MDAC during the sampling and holding periods is similar to the first embodiment of the present invention, and accordingly, Equation 2 to Equation 5 are applied to the operation of the MDAC according to the second embodiment of the present invention.

Thus, an output voltage of the MDAC according to the second embodiment of the present invention is given in Equation 9:

$$V_{OUT} = \{[V_{IN}N + V_{REF}(N - 2M)] \times C + V_{OS}C_F\} / \qquad \text{[Equation 9]}$$
$$C_F = [V_{IN} - V_{REF} \times (2M/N - 1)] \times (NC/C_F) +$$
$$V_{OS}.$$

When comparing Equation 9 to Equation 6, an offset still partially exists, but it is not amplified. The compensation capacitor according to the second embodiment includes the first compensation capacitors $C_{C1}$ and $C_{CB2}$ and the second compensation capacitors $C_{C2}$ and $C_{CB2}$ in a parallel connection, as shown in FIG. 4. The switch SW4 controls the connection of the second compensation capacitors $C_{C2}$ and $C_{CB2}$, and switches the size of the compensation capacitor in each phase.

In other words, the size of the compensation capacitor is switched in each phase in the MDAC structure according to the second embodiment of the present invention. Thus, the amplifier may be designed to satisfy variable characteristics of the loop in each phase.

In more detail, since feedback factors are low during the holding period, the switches $SW_4$ and $SW_{4B}$ are turned off to reduce capacity of a phase compensation capacitor for high frequency response to thereby increase operation speed. When a unit-gain feedback can be made, the switches $SW_4$ and $SW_{4B}$ are turned on to reduce the frequency to gain the phase margin.

Figure 5:
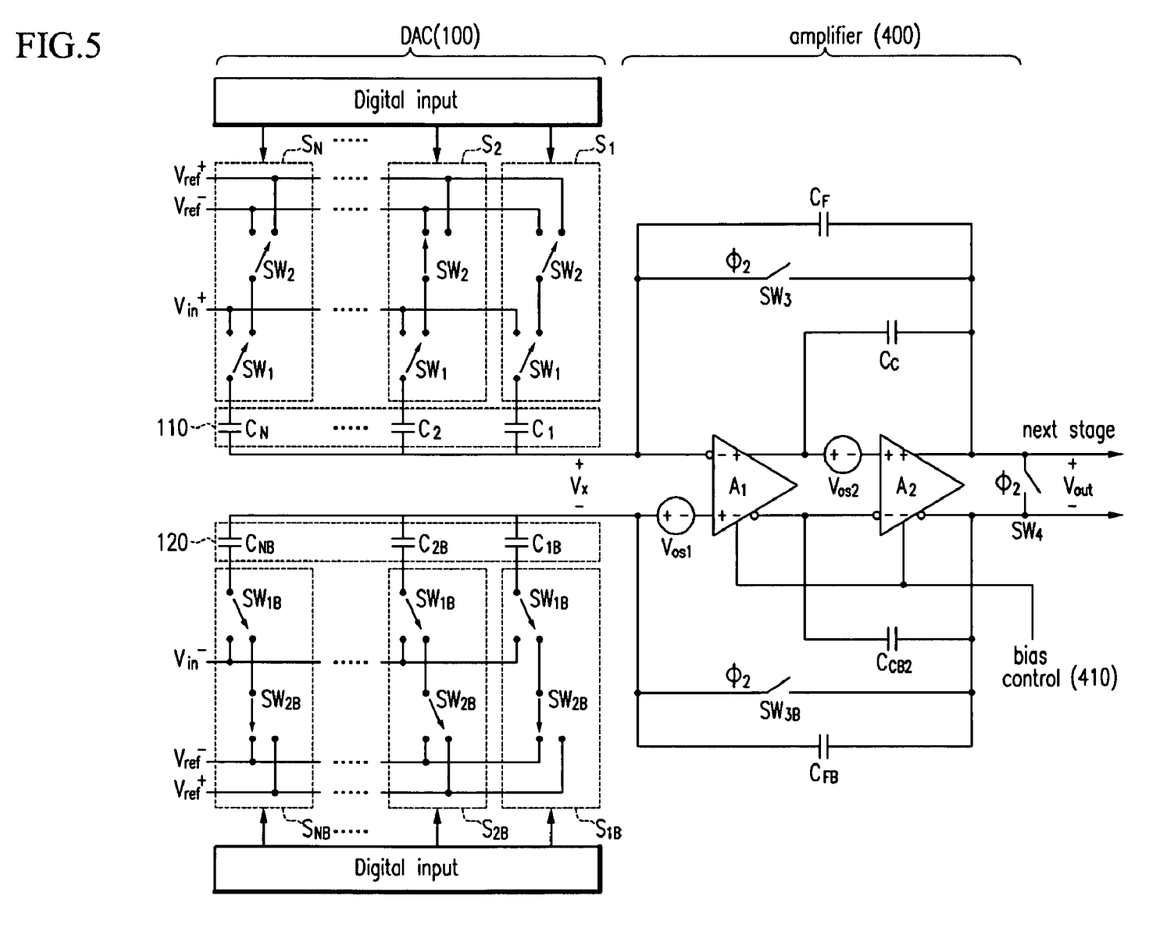
FIG. 5 is a circuit diagram of a multiplying analog to digital converter according to a third embodiment of the present invention.

Referring to FIG. 5, a MDAC according to a third embodiment of the present invention will be described.

FIG. 5 is a circuit diagram of the MDAC according to the third embodiment of the present invention.

As shown therein, the MDAC includes a DAC 100 and an amplifier 400. The DAC 100 is similar to the DAC 100 according to the first embodiment of the present invention, and thus a detailed description will be omitted.

The amplifier 400 includes a first capacitor array 110, a first amplifier $A_1$, a second amplifier A2, compensation capacitors $C_C$ and $C_{CB}$, feedback capacitor $C_F$ and $C_{FB}$, switches $SW_3$, $SW_{3B}$, and $SW_4$, and a bias control 410.

In the amplifier 400, a first end of the switch $SW_3$ is coupled to inputs of the first capacitor array 110 and the first amplifier $A_1$, and a second end thereof is coupled to an output end of the second amplifier $A_2$. A first end of the compensation capacitor Cc is coupled to an input end of the second amplifier A2, and a second end thereof is coupled to t the output of the second amplifier A2. The bias control 410 is coupled to the first ends of the first and second amplifiers A1 and A2.

The switch $SW_{3B}$, the compensation capacitor $C_{CB}$, and the feedback capacitor $C_{FB}$ are coupled to each other in the same way as the switch $SW_3$, the compensation capacitor Cc, and the feedback capacitor $C_F$ are coupled.

An operation of the MDAC according to the third embodiment of the present invention will be described in more detail.

The operation of the MDAC will be focused to an operation of the amplifier 400 because the DAC 100 is similar to the operation of the DAC according to the first embodiment of the present invention.

During a clock sampling period $\phi_2$, an input voltage $V_{IN}^+$ is stored in the first capacitor array 110 through the first selection circuit. Herein, the switches $SW_3$ and $SW_4$ are turned on.

During a clock holding period $\phi_1$, the input voltage $V_{IN}^+$ is intercepted, the first capacitor array 110 is coupled to a positive reference voltage $V_{REF}^+$ or a negative reference voltage $V_{REF}^-$ through the first selection circuit, and the switches $SW_3$ and $SW_4$ are turned off. Herein, the first capacitor array 110 is coupled to the positive reference voltage $V_{REF}^+$ or a negative reference voltage $V_{REF}^-$ depending on a digital output of a sub-ADC.

According to the third embodiment of the present invention, a current flowing to first and second amplifiers is changed between the sampling period and the holding period (amplifying period) through the bias control 410 coupled to the first and second amplifiers.

Gains of the first and second amplifiers become differentiated by the change of the current flow between the sampling period and the holding period (amplifying period).

Thus, it is possible to design an amplifier that satisfies characteristics of the loop that varies in each phase.

In more detail, the current flowing to the first amplifier is reduced and the current flowing to the second amplifier is increased during the sampling period to gain the phase margin since the feedback factors are high during the sampling period. During the holding period, the current flowing to the first amplifier is increase and the current flowing to the second amplifier is reduced to maximize the operation speed and minimize power consumption since the feedback factors are low during the holding period. In addition, an amount of the current flowing one of the first and second amplifiers is set to be fixed and a current flowing to the other amplifier is set to be periodically changed to thereby control the currents with ease.

As previously described, the multipath ADC removes the offset without requiring an additional offset calibration circuit according to the embodiments of the present invention.

The ADC exploiting the MDAC removes the offset voltage while gaining the phase margin.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A multiplying digital to analog converter comprising:
a digital to analog converter including a first digital to analog converter receiving a positive voltage and a second digital to analog converter receiving a negative voltage, a plurality of capacitors coupled in parallel, applying first signals to the capacitors during a sampling period, and applying second signals to the capacitors during an amplifying period; and
an amplifier including
a first amplifier coupled to the digital to analog converter,
a second amplifier coupled to the first amplifier, and
a first switch coupled between an input end and an output end of the second amplifier, being turned off during the sampling period, and being turned on during the amplifying period,
wherein, depending on polarity of an analog signal to be amplified,
the first amplifier amplifies a positive voltage, and
the second amplifier amplifies a negative voltage.

2. The multiplying digital to analog converter of claim 1, wherein the amplifier further comprises a second switch coupled between input and output ends of the first amplifier, being turned on during the sampling period, and being turned off during the amplifying period.

3. The multiplying digital to analog converter of claim 2, wherein the amplifier further comprises a first capacitor provided to a loop that couples the input end of the first amplifier and the output end of the second amplifier.

4. The multiplying digital to analog converter to claim 3, wherein the amplifier further comprises a second capacitor coupled between the input and output ends of the second amplifier, and being turned on/off by the first switch.

5. The multiplying digital to analog converter of claim 1, wherein a loop is configured with the first amplifier during the sampling period.

6. A multipath pipelined analog to digital converter having a plurality of stages, wherein each stage comprises an analog to digital converter having a plurality of stages, wherein the multiplying digital to analog converter is the multiplying digital to analog converter of claim 1.

7. A multiplying digital to analog converter comprising:
a digital to analog converter having a plurality of capacitors coupled in parallel, applying first signals to the capacitors during a sampling period, and applying second signals to the capacitors during an amplifying period, depending on polarity of an input analog signal, the digital to analog converter further includes a first digital to analog converter receiving a positive voltage; and a second digital to analog converter receiving a negative voltage; and an amplifier including,
a first amplifier coupled to the digital to analog converter,
a second amplifier coupled to the first amplifier,
a first capacitor coupled between an input end and an output end of the second amplifier,
a second capacitor coupled to bother ends of the first capacitor, and
a first switch coupled between the first and second capacitors, being turned on during the sampling period, and being turned off during the amplifying periods, wherein, depending on polarity of an analog signal to be amplified,
the first amplifier amplifies a positive voltage, and
the second amplifier amplifies a negative voltage.

8. The multiplying digital to analog converter of claim 7, wherein the amplifier further comprises a third capacitor provided to a loop coupling an input end of the first amplifier and the output end of the second amplifier.

9. A multipath pipelined analog to digital converter having a plurality of stages,
wherein each stage comprises an analog to digital converter and a multiplying digital to analog converter, and
wherein the multiplying digital to analog converter is the multiplying digital to analog converter of claim 8.

10. The multiplying digital to analog converter of claim 7, wherein the first switch is turned on to couple the first and second capacitors in parallel during the sampling period, and wherein the first switch is turned off to intercept the second capacitor and couple the first capacitor during the amplifying period.

11. A multipath pipelined analog to digital converter having a plurality of stages,
wherein each stage comprises an analog to digital converter and a multiplying digital to analog converter, and
wherein the multiplying digital to analog converter is the multiplying digital to analog converter of claim 7.

12. A multiplying digital to analog converter comprising:
a digital to analog converter having a plurality of capacitors coupled in parallel, applying first signals to the capacitors during a sampling period, and applying second signals to the capacitors during an amplifying period, depending on polarity of an input analog signal, the digital to analog converter further includes a first digital to analog converter receiving a positive voltage; and a second digital to analog converter receiving a negative voltage; and an amplifier including
a first amplifier coupled to the digital to an analog converter,
a second amplifier coupled to the first amplifier, and
a bias input end coupled to an end of the first amplifier and an end of the second amplifier, and controlling currents of the first and second amplifiers, wherein, depending on polarity of an analog signal to be amplified,
the first amplifier amplifies a positive voltage, and
the second amplifier amplifies a negative voltage.

13. The multiplying digital to analog converter of claim 12, wherein the amplifier further comprises a first capacitor provided to a loop coupling an input end of the first amplifier and the output end of the second amplifier.

14. A multipath pipelined analog to digital converter having a plurality of stages,
wherein each stage comprises an analog to digital converter and a multiplying digital to analog converter, and
wherein the multiplying digital to analog converter is the multiplying digital to analog converter of claim 13.

15. The multiplying digital to analog converter of claim 12, wherein the current of the first amplifier is reduced and the current of the second amplifier is increased during a sampling period, and the current of the first amplifier is increased and the current of the second amplifier is reduced during an amplifying period.

16. A multipath pipelined analog to digital converter having a plurality of stages,
wherein each stage comprises an analog to digital converter and a multiplying digital to analog converter, and
wherein the multiplying digital to analog converter is the multiplying digital to analog converter to claim 12.

* * * * *